United States Patent
Asato

[19]

[11] Patent Number: 5,886,541
[45] Date of Patent: Mar. 23, 1999

[54] COMBINED LOGIC GATE AND LATCH

[75] Inventor: Creigton Asato, San Jose, Calif.

[73] Assignee: Fujitsu Limited, Kanagawa, Japan

[21] Appl. No.: 692,541

[22] Filed: Aug. 5, 1996

[51] Int. Cl.$^6$ .................... H03K 19/096; H03K 19/00
[52] U.S. Cl. ................ 326/93; 326/17; 326/98; 327/219
[58] Field of Search .................. 326/95–98, 112, 326/119, 121, 17, 27, 93; 327/219, 436

[56] References Cited

U.S. PATENT DOCUMENTS

| | | | |
|---|---|---|---|
| 4,700,086 | 10/1987 | Ling et al. | 326/98 |
| 4,972,102 | 11/1990 | Reis et al. | 326/121 |
| 5,027,012 | 6/1991 | Soeki et al. | 326/114 |
| 5,070,262 | 12/1991 | Hashimoto | 326/98 |

*Primary Examiner*—Jon Santamauro
*Attorney, Agent, or Firm*—Skjerven, Morrill, MacPherson, Franklin & Friel; David T. Millers

[57] ABSTRACT

A circuit combines the functions of a logic gate and a latch to lower steady state power dissipation during gate operation. The circuit operates in two modes: a flow-through mode and a latched mode. In the flow-through mode, a gate portion which receives one or more digital input signals implements the complement of a desired Boolean logic function on the input signals and provides an internal signal. The gate portion may have a steady-state power dissipation while providing the internal signal. An inverter in a latch portion of the circuit inverts the internal signal to generate an output signal which represents the desired logical combination of the input signals. The inverter provides the output signal with a full-range CMOS voltage. In latched mode, the gate portion is disabled to stop the steady-state power dissipation while the latch portion of the circuit preserves the desired output signal.

12 Claims, 8 Drawing Sheets

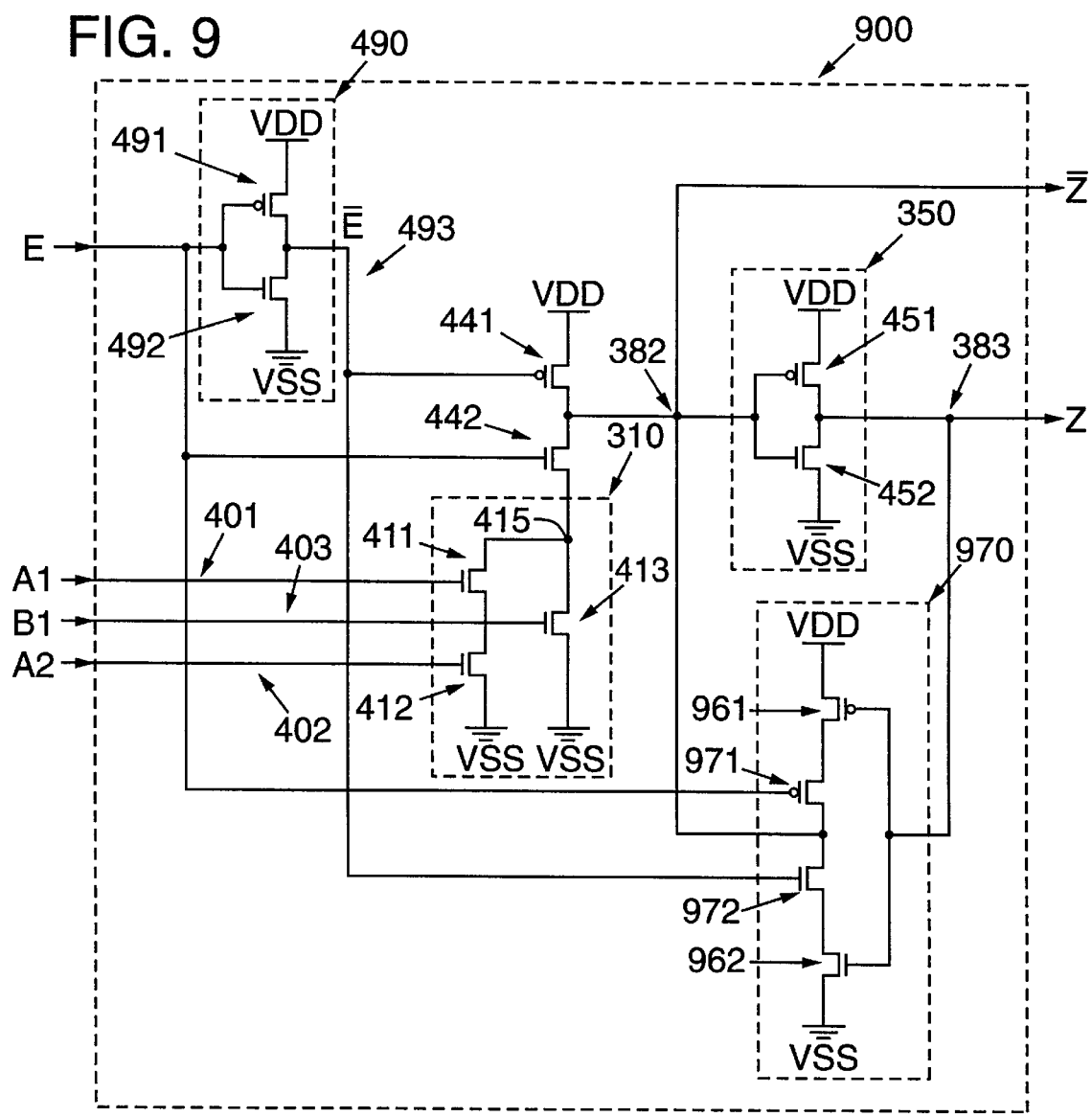

COMBINED LOGIC GATE AND LATCH

BACKGROUND OF THE INVENTION

1. Field of the Invention

This invention relates to digital logic circuits and, more particularly, to logic circuits having level-sensitive latched outputs.

2. Description of Related Art

Logic gates such as NAND and NOR gates are well known for generating output signals representing logical combinations of the states of input signals. Many ways for implementing there logic gates are known. Pseudo-nMOS logic gates illustrate one implementation. FIG. 1 shows a block diagram of a conventional pseudo-nMOS logic gate 100 that can be fabricated using a CMOS process. Logic gate 100 receives a plurality of binary input signals X1 to XN and generates a binary output signal Z representing a logical combination of the states of input signals X1 to XN. Logic gate 100 includes a current source 120 which acts as a pull-up device and a pull-down network 110 (typically constructed from n-channel MOSFETs). Current source 120 is typically constructed using a p-channel MOSFET having a source connected to a supply voltage VDD, a drain connected to an output terminal 130 of logic gate 100, and a gate connected to a reference voltage VSS (ground potential). Pull-down network 110 is constructed so that when a desired logical combination of the states of input signals X1 to XN is "false" or a binary "0", pull-down network 110 shorts output terminal 130 to reference voltage VSS. This pulls output signal Z down to binary "0" or "false". When the desired logical combination of the input states is "true" or a binary "1", no complete path through pull-down network 110 conducts a current; and current source 120 pulls output signal Z up to a binary "1" or "true".

An advantage of pseudo-nMOS logic gate 100 is that a relatively simple and straight forward transistor network 110 can pull down output signal Z when desired for a complex logic function. A disadvantage of pseudo-nMOS logic gate 100 is the power dissipation caused by the current through pull-down network 110 when output signal Z is stable at a binary "0". Because of this current, pseudo-nMOS logic gates typically consume more power than other CMOS gates and may require special attention to ensure that the pseudo-nMOS gate have an adequate power supply. The static power consumption may make pseudo-nMOS logic gates unsuited for low-power circuits.

Another disadvantage of pseudo-nMOS logic gate 100 is that output signal Z when at binary "0" is above reference voltage VSS; and if the output of pseudo-nMOS logic gate 100 is connected to the input of a CMOS gate, the binary "0" state voltage level may cause the CMOS gate to dissipate power even when inputs are unchanging. Since CMOS gates usually dissipate power only when inputs are switching, the dissipation of power when inputs are stable may be unexpected and undesirable. This discourages mixing pseudo-nMOS logic gates and CMOS circuits.

Latches are another well known type of digital circuit. FIG. 2 shows the block diagram of a level-sensitive latch 200. Latch 200 consists of switches 240 and 270 and inverters 250 and 260 and operates in two modes, flow-through mode and latched mode. In flow-through mode, switch 240 is closed (i.e. conducts) and switch 270 is open (i.e. does not conduct), so that an input data signal D is applied to an input node 282 of inverter 250. In flow-through mode, an inverted output signal $\overline{Q}$ from inverter 250 is the logical complement of input data signal D, and an output signal Q from inverter 260 has the same binary state as input signal D. In latched mode, data switch 240 is open to disconnect input signal D from node 282 and data switch 270 is closed to short node 284 to node 282. In latched mode, output signals Q and $\overline{Q}$ retain the logic states from when latch 200 entered latched mode. Typically, switches 240 and 270 are transmission gates controlled by an enable signal. When the enable signal has one binary state, latch 200 is in flow-through mode; and when the enable signal has the other binary state, latch 200 is in latched mode.

SUMMARY OF THE INVENTION

In accordance with an aspect of the invention, a circuit combines a logic gate and a level-sensitive latch where power to the logic gate is enabled and disabled by a signal which controls the operating mode of the latch. Accordingly, the logic gate is disabled to avoid dissipation of power while the latch retains an output signal having a CMOS compatible voltage level. In one embodiment, the logic gate is a pseudo-nMOS logic gate having a current source with an enable. When in a flow-through mode, the current source of the logic gate is enabled; and the logic gate has an output signal that is a logical combination of input signals. The latch inverts the output signal from the logic gate. When in a latched mode, the current source is disabled, and the latch maintains the output signal at a CMOS level. The current source being disabled (or turned off) doesn't affect the output signal of the latch but does reduce power dissipation because the circuit dissipates static power only in flow-through mode. In latched mode, power dissipation stops once internal circuit nodes stabilize. This can reduce the total amount of current dissipated while retaining the speed of the original logic gate. The latched output signal is also fully CMOS-compatible and is nearly at either the supply or reference voltage levels (VDD or VSS) when in a stable state. This allows direct connection of the output signal to standard CMOS logic without inducing static power dissipation in the CMOS logic.

BRIEF DESCRIPTION OF THE DRAWINGS

FIG. 9 is a circuit diagram of an alternate embodiment of a combined logic gate and latch in accordance with the invention.

Use of the same reference symbols in different figures indicates similar or identical items.

DETAILED DESCRIPTION OF THE PREFERRED EMBODIMENTS

In accordance with an aspect of the invention, a combined gate and latch (also referred to herein as a gate/latch) incorporates latch functions into a logic gate to reduce static power dissipation, increase speed, and provide a CMOS compatible output signal. The gate/latch circuit operates in a flow-through mode where an output signal depends on the states of input signals and in a latched mode which preserves the output signal in a steady state with low power dissipation. While operating in the latched mode, input signals can change without disturbing the output signal, and the output signal is fully CMOS compatible.

Figure 1:
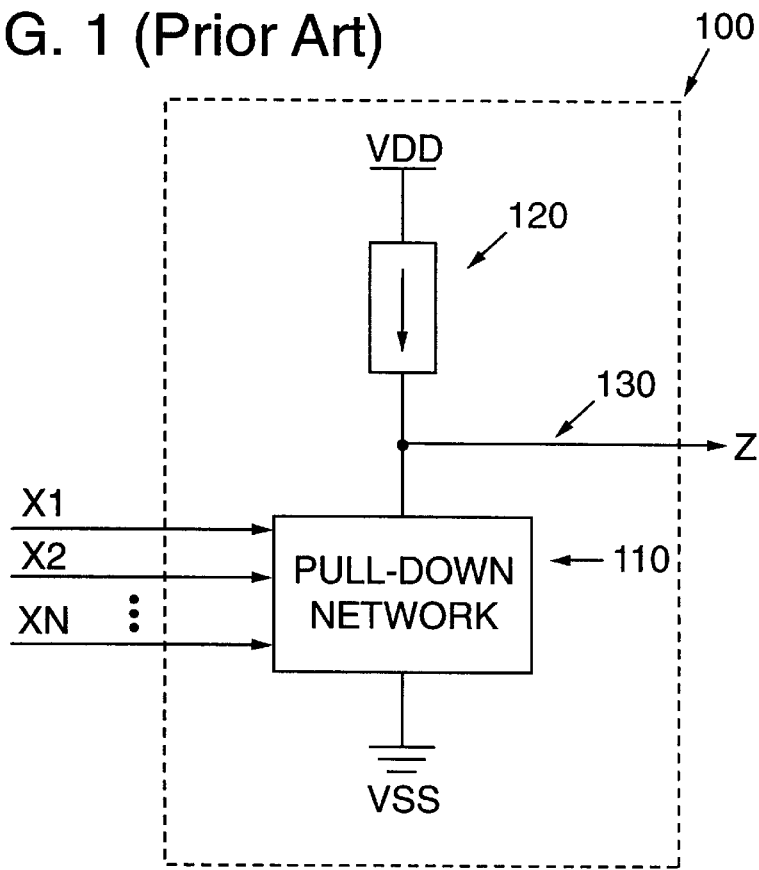
FIG. 1 is a block diagram of a prior art pseudo-nMOS logic gate.
Figure 2:
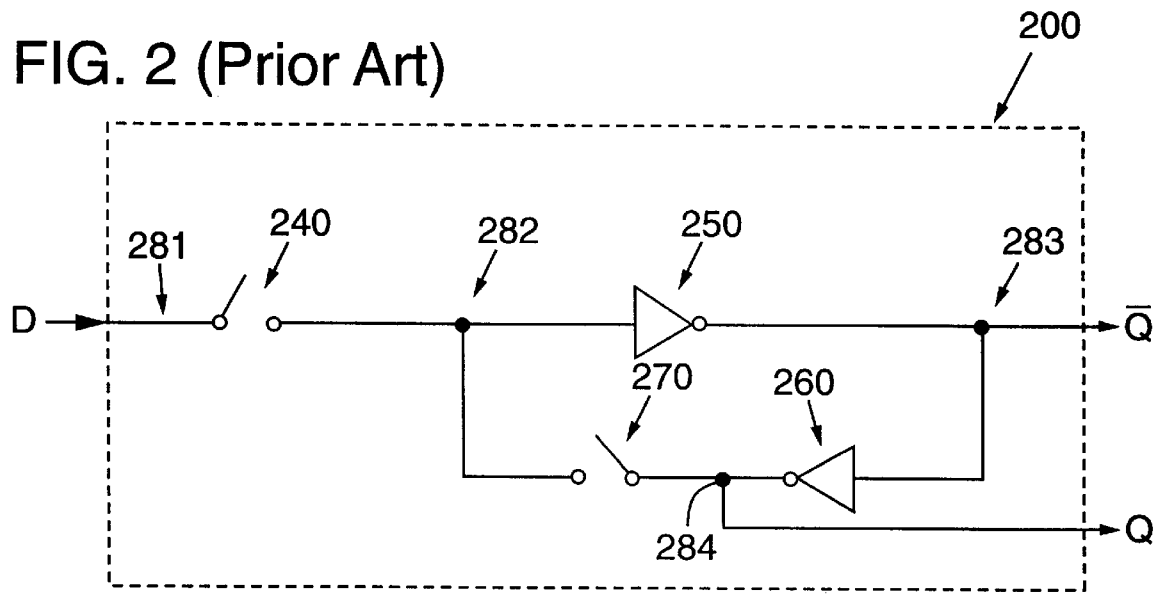
FIG. 2 is a block diagram of a prior art level-sensitive latch.
Figure 3:
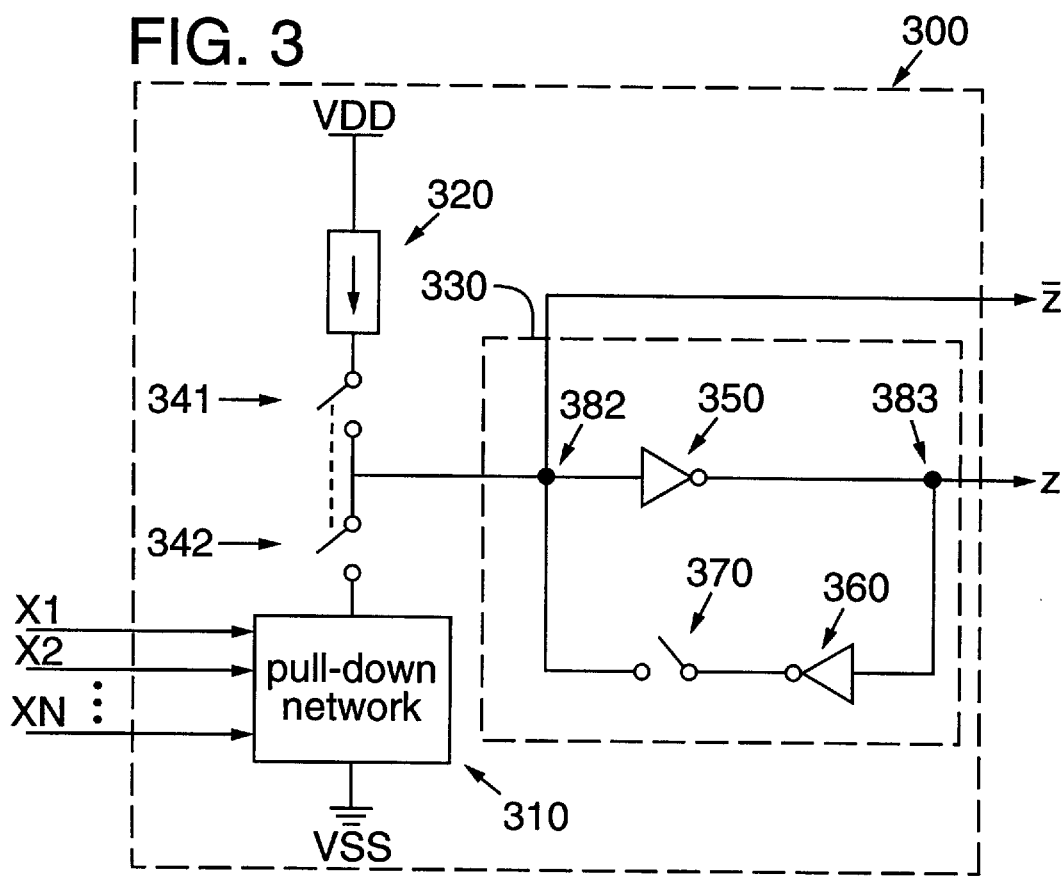
FIG. 3 is a block diagram of a combined logic gate and latch in accordance with an embodiment of the invention.

FIG. 3 shows a block diagram of a gate/latch 300 in accordance with an embodiment of the invention. Gate/latch 300 includes a pull-down network 310 and a current source 320 coupled to an input terminal of a latch 330. Switches 341, 342, and 370 select an operating mode for gate/latch 300. Switches 341 and 342 are "ganged" to close (conduct) and open (stop conducting) together. Switch 370 opens when switches 341 and 342 close and closes when switches 341 and 342 open.

When switches 341 and 342 are closed and switch 370 is open, gate/latch 300 operates in a flow-through mode. Switch 341 connects current source 320 to an input node 382 of an inverter 350 in latch 330. Switch 342 connects pull-down network 310 to node 382, and switch 370 disconnects an inverter 360 in latch 330 from node 382. In the flow-through mode, gate/latch 300 generates an output signal Z representing the result of a desired logical combination of the states of input signals X1 to XN. The desired logical combination can be any Boolean function. Pull-down network 310 implements the complement of the desired Boolean operation by connecting node 382 (via switch 342) to a reference voltage VSS when the result of the desired Boolean operation on the states of signals X1 to XN is "true" or "1" and disconnecting node 382 from reference voltage VSS when the result is "false" or "0". Thus, in flow-through mode, pull-down network 310 pulls the voltage at node 382 toward a binary "0" when the results of the desired Boolean operation is true; and current source 320 pulls the voltage at node 382 to a binary "1" when the result of the desired Boolean operation is false. Inverter 350 generates output signal Z which is complementary to the voltage at input node 382 and thus matches the desired logical combination.

An output voltage from inverter 360 is complementary to signal Z and is in the same binary state as the voltage at node 382. In an alternative embodiment of the invention, pull-down network 310 implements the desired Boolean operation with the correct polarity (rather than inverted) and output signal $\bar{Z}$ either from node 382 or the output from inverter 360 is the desired output signal. A disadvantage of using the output signal from inverter 360 is propagation delays through two inverters 350 and 360 which slow generation of the output signal. The voltage at node 382 does not suffer from delays through inverter 350 or 360, but in flow-through mode, resistance in pull-down network 310 causes the voltage at node 382 to be above a reference voltage VSS when in binary state "0 ".

Gate/latch 300 operates in a latched mode when switches 341 and 342 are open and switch 370 is closed. Switches 341 and 342 disconnect node 382 from current source 320 and pull-down network 310, and switch 370 connects an output terminal of inverter 360 to node 382. In latched mode, no current flows through current source 320 or pull-down network 310 because no continuous connection between voltages VDD and VSS includes current source 320 or pull-down network 310. Node 382 is isolated from current source 320 and pull-down network 310 allowing inverter 360 control the voltage at node 382. This causes a positive feedback which sets signals Z and $\bar{Z}$ according to the voltage levels those signals had when gate/latch 300 first entered latched mode.

Figure 4:
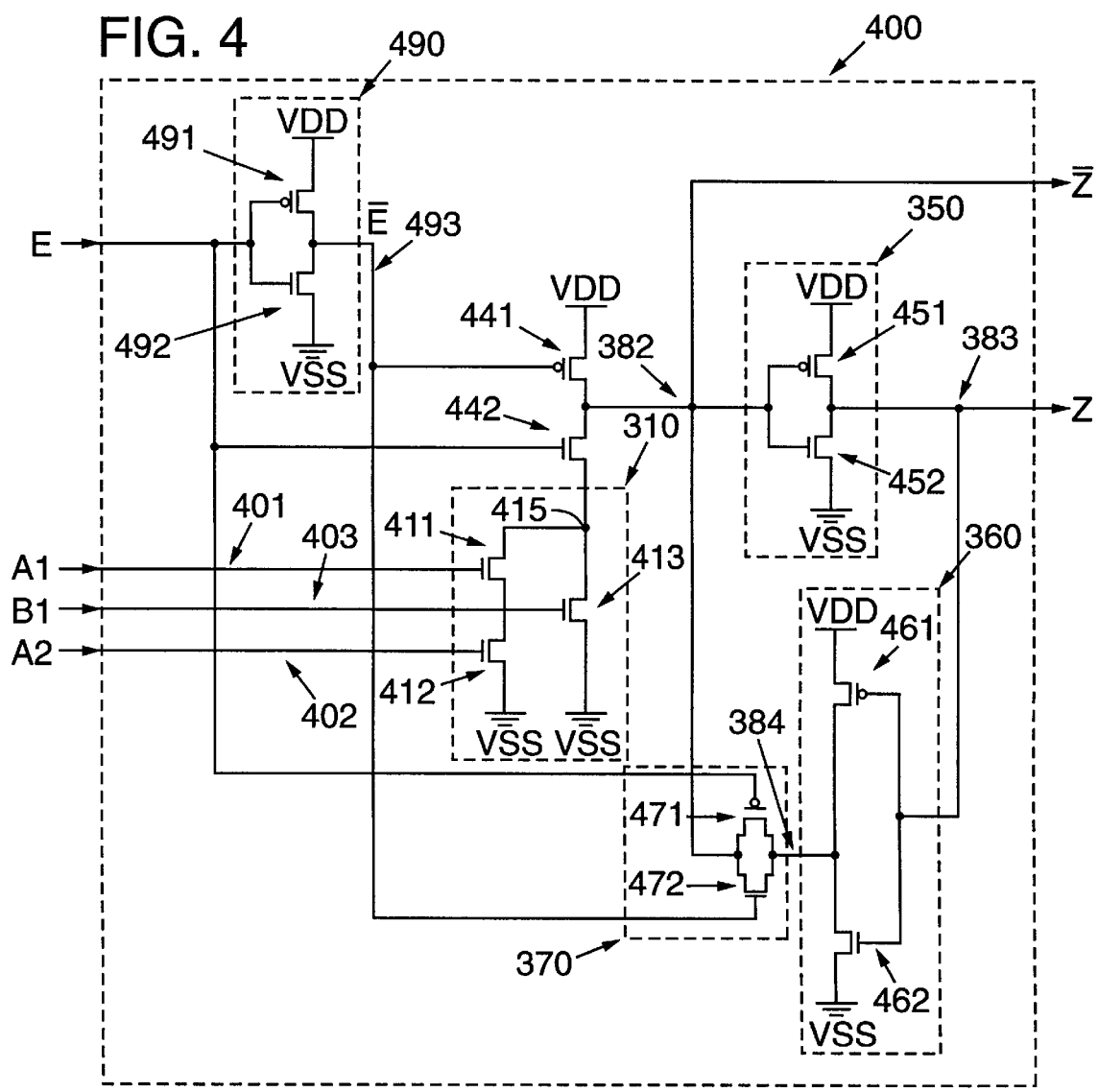
FIG. 4 is a schematic diagram of a CMOS embodiment of the circuit depicted in FIG. 3.

FIG. 4 illustrates a CMOS gate/latch 400 which provides a 2-1 AND-OR gate with a latched output. Gate/latch 400 generates output signal Z from input signals A1, A2, and B1 according to the logical relation Z=(A1 AND A2) OR B1. Gate/latch 400 contains elements corresponding to those described in regard to gate/latch 300 of FIG. 3. In gate/latch 400, pull-down network 310 implements a 2-1 AND-OR-INVERT function using n-channel transistors 411 to 413. Input signals A1 and A2 are applied to the gates of transistors 411 and 412 which are connected in series between a node 415 and reference voltage VSS. Accordingly, transistors 411 and 412 conduct if input signals A1 and A2 are both in binary "1"state. Input signal B1 is applied to the gate of transistor 413 which is connected between node 415 and reference voltage VSS and is in parallel with transistors 411 and 412. Transistor 413 conducts if input signal B1 is in a binary "1" state. Accordingly, network 310 is conductive if signals A1 and A2 are both binary "1" or signal B1 is a binary "1". Transistors 411 to 413 can perform NAND, NOR, AND-OR-INVENT, AND OR-AND-INVERT functions depending on the input signals applied. For example, if signal B1 is fixed at binary 0, gate/latch 400 performs a logical AND of signals A1 and A2. In other embodiments of the invention, more complex or less complex pull-down networks can be employed for other logical operations having more or fewer input signals and transistors.

An n-channel MOS transistor 442 implements switch 342, and a p-channel transistor 441 implements both switch 341 and current source 320. The size of transistor 441 determines the magnitude of a pull-up current and is selected according to the sizes of the transistors 411 to 413 which form pull-down network 310. A passgate including a p-channel transistor 471 and an n-channel transistor 472 forms switch 370. Each of inverters 350 and 360 is a conventional CMOS inverter which includes a p-channel transistor 451 or 461 and an n-channel transistor 452 or 462 connected in series between supply voltage VDD and reference voltage VSS.

An enable signal E controls whether gate/latch 400 operates in flow-through mode or latched mode. In gate/latch 400, binary states "0" and "1" of enable signal E correspond to latched mode and flow-through mode respectively. (A complementary convention can be employed with minor circuitry changes.) An inverter 490 in gate/latch 400 generates a signal $\bar{E}$ which is complementary to enable signal E. In flow-through mode, signals E and $\bar{E}$ close transistors 441 and 442 and open passgate 370.

In flow through mode, the voltage at node 382 (i.e. signal $\bar{Z}$) depends on the size of p-channel transistor 441 relative to the ones of n-channel transistors 442 and 411 to 413 that conduct. Transistors 411 to 413 are connected so that signal $\bar{Z}$ represents NOT [(A1 AND A2) OR B1], but resistance in pull-down network 310 may keep signal $\bar{Z}$ above reference voltage VSS when in binary state "0". This could cause connected CMOS gates to draw steady state power. Inverter 350 inverts signal $\bar{Z}$ so that output signal Z represents [(A1 AND A2) OR B1] and sets output signal Z so that binary "0" and "1" levels are nearly equal to voltages VSS and VDD, respectively.

Figure 5:
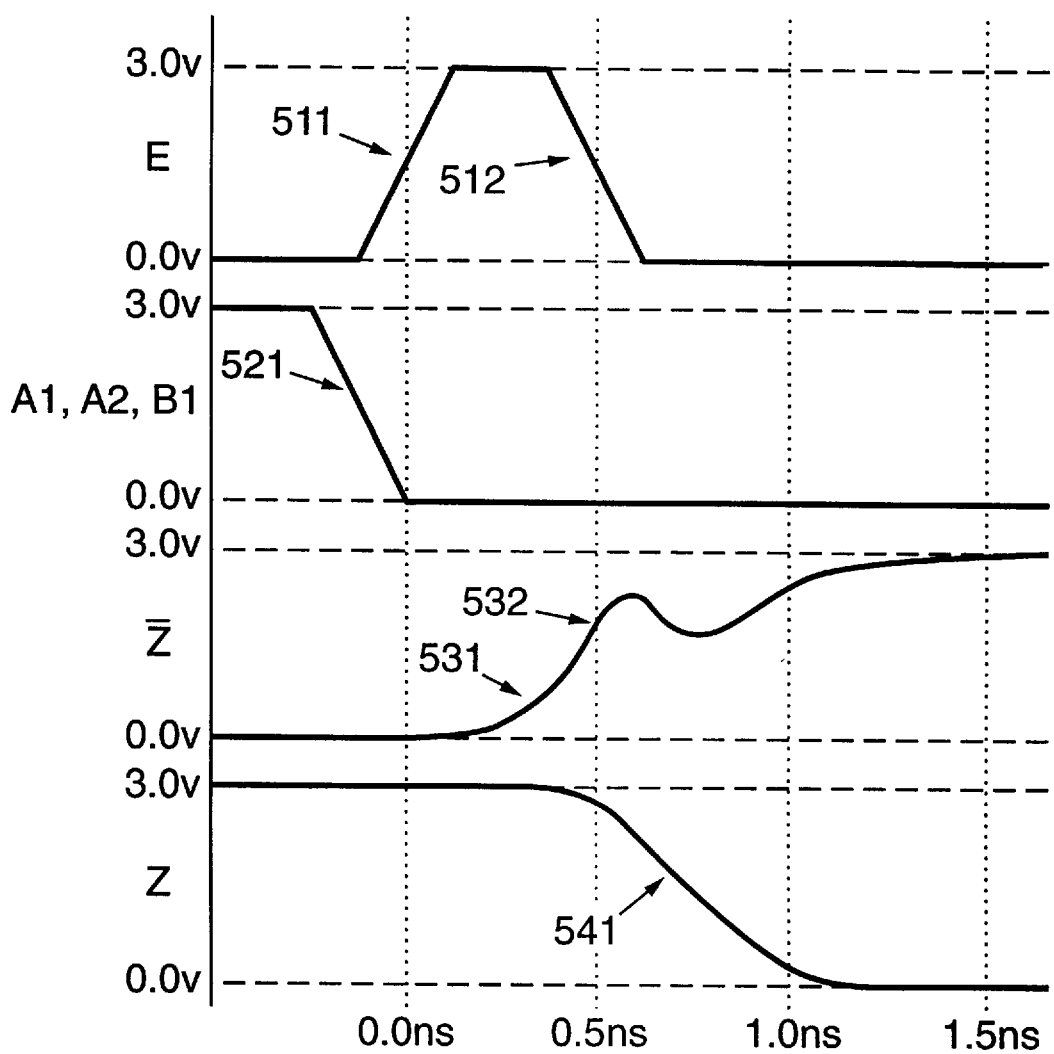
FIGS. 5 and 6 show waveforms generated in the circuit of FIG. 4 when an output signal changes.

FIG. 5 shows voltages in gate/latch 400 of FIG. 4 when input signals A1, A2, and B1 change and cause output signal Z to fall. Gate/latch 400 is in latched mode at a time 521 when input signals A1, A2, and B1 drop to binary "0". To allow the change in logical combination of A1, A2, and B1 to propagate to output signal Z, enable signal E pulses from 0 volts (VSS) to 3.0 volts (VDD) between times 511 and 512, temporarily placing gate/latch 400 in flow-through mode. Signal $\bar{Z}$ at internal node 382 rises at time 531 in response to the current through p-channel transistor 441; and after a delay, output signal Z falls. At time 512, enable signal E falls switching gate/latch 400 back to latched mode. Signal $\overline{Z}$ is not yet a valid logic level at time 512, but signal $\overline{Z}$ is above the threshold of inverter 350 and causes inverter 350 to pull output signal Z down to reference voltage VSS. Feedback from inverters 350 and 360 drives signal $\overline{Z}$ to supply voltage VDD, which shuts off power dissipation inside gate/latch 400. A speed advantage for gate/latch 400 is that the pull-down network 310 does not have to pull intermediate signal $\overline{Z}$ to a valid binary voltage level. Signal $\overline{Z}$ only needs to be high or low enough that inverters 350 and 360 produce a valid binary output voltage. Gate/latch 400 can therefore be faster than a conventional pseudo-nMOS gate.

Figure 6:
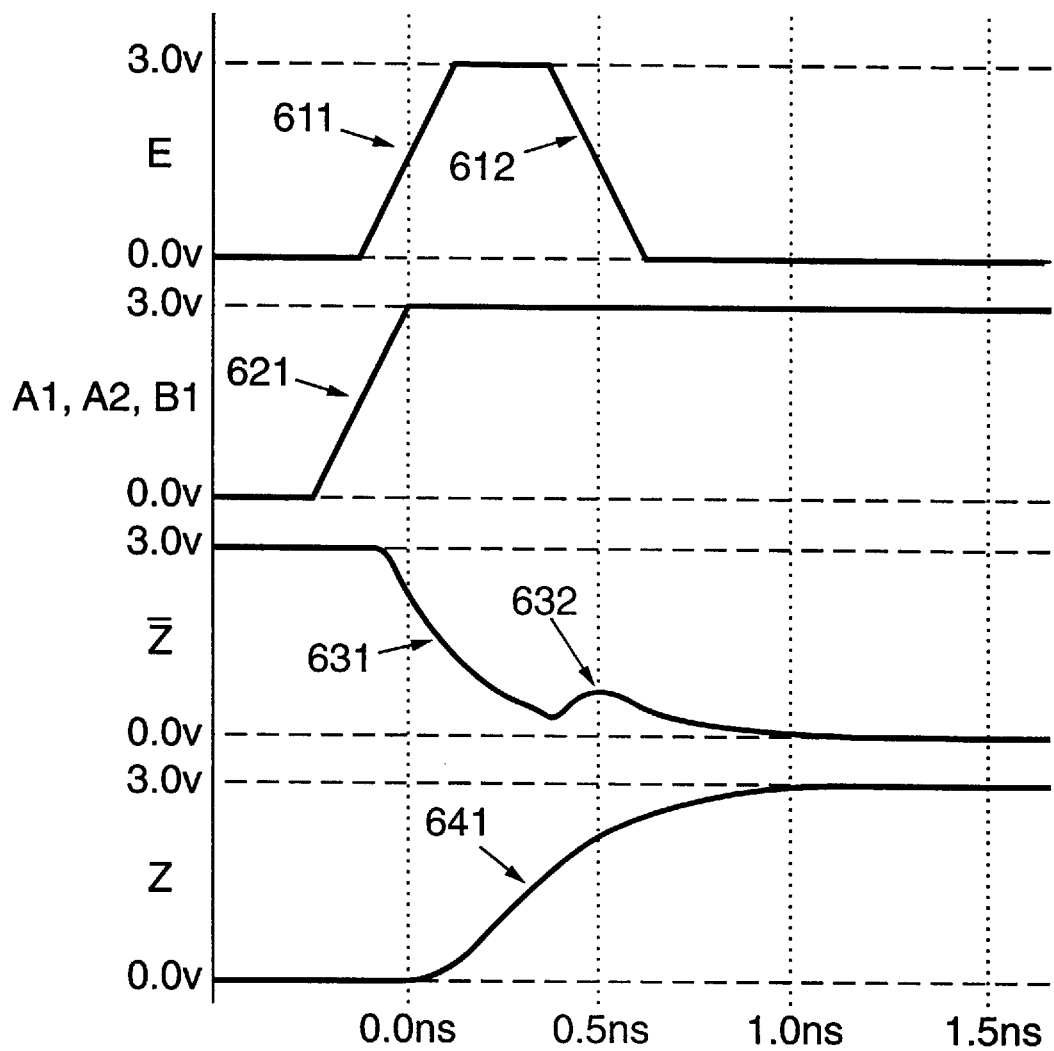

FIG. 6 shows timing diagrams where input signals A1, A2, and B1 rise at time 621. The rise in signals A1, A2 and B1 turns on transistors 411 to 413 in pull-down network 310. Enable signal E switches gate/latch 400 into flow-through mode at time 611 which allows pull-down network 310 to pull signal $\overline{Z}$ down. At time 612, when gate/latch 400 goes back to latched mode, signal $\overline{Z}$ is above 0 volts but is low enough to cause inverter 350 to pull up output signal Z. Feedback through inverter 470 drives signal $\overline{Z}$ to 0 volts, which cuts off power dissipation.

During operation of gate/latch 400, enable signal E must stay high long enough for signal $\overline{Z}$ to cross the threshold level of inverter 350 so that feedback through inverters 350 and 360 reinforces the change in signal $\overline{Z}$ when gate/latch 400 returns to latched mode. Otherwise, signal Z may not change state, or could end up in an intermediate (or metastable) state, which is a common problem in latch circuits. Keeping gate/latch 400 in flow-through mode for longer periods reduces the potential for metastability but also increases the total power dissipated during switching of output signal Z.

Although FIGS. 5 and 6 show transitions in the input signals occurring before gate/latch 400 switches into flow-through mode, input signals A1, A2, and B1 can transition after placing the gate/latch 400 in flow-through mode if the time in flow-through mode after the change in input signals A1, A2, and B1 is sufficient to cause output signal Z to change. The time required to ensure that output signal Z matches the desired combination of input signals A1, A2, and B1 is referred to as the setup time. Conventional latches similarly have setup times, although for latches the setup time is the time required for the output signal to match a single input signal.

Figure 7:
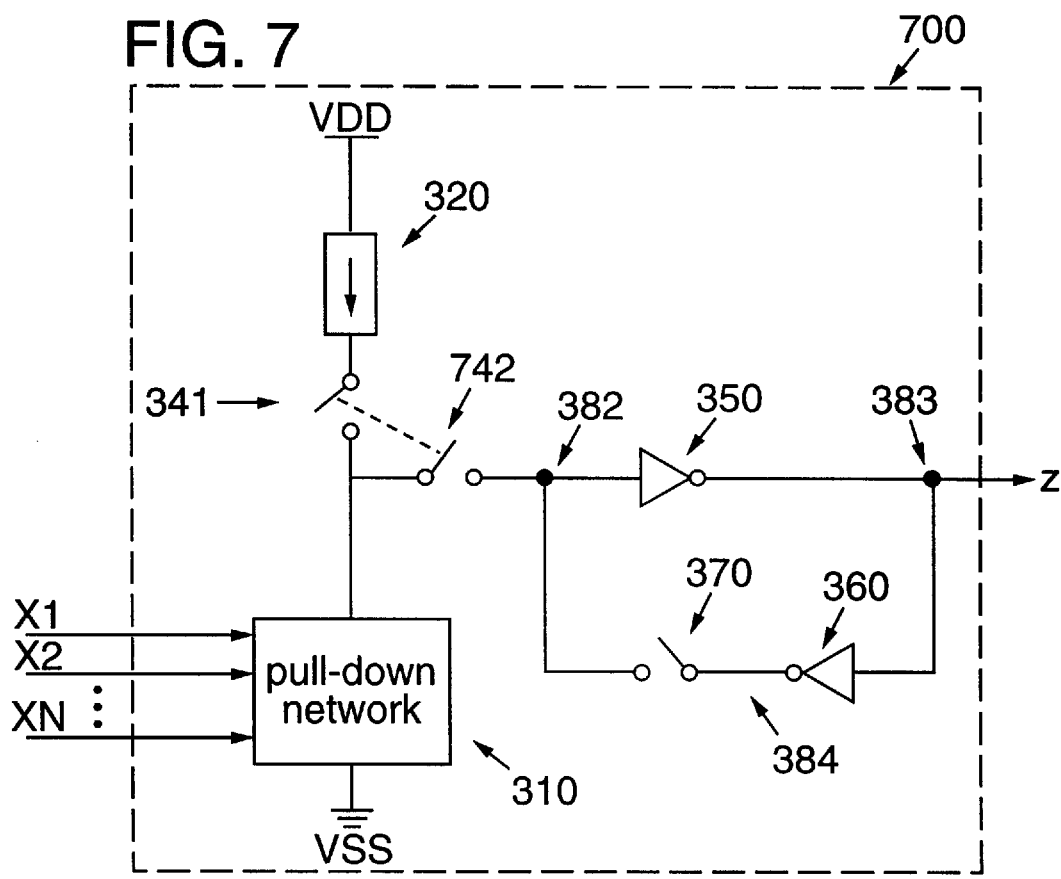
FIGS. 7 and 8 are block diagrams of alternative embodiments of gate/latch circuits in accordance with the invention.

FIG. 7 shows a block diagram of a gate/latch 700 in accordance with another embodiment of the invention. Gate/latch 700 is identical to gate/latch 300 of FIG. 3 except that switch 342 of FIG. 3 is removed, switch 341 directly couples to pull-down network 310, and switch 742 is inserted between pull-down network 310 and node 382 in gate/latch 700. Gate/latch 700 operates in substantially the same manner as gate latch 300. Switches 341 and 742 are ganged together and operate opposite to switch 370 to switch gate/latch 700 between flow-through and latched mode. In a CMOS circuit, switch 742 should be a transmission gate (a p-channel transistor and an n-channel transistor in combination) to best pull node 382 up or down as required for a maximum swing in the voltage at node 382.

Figure 8:
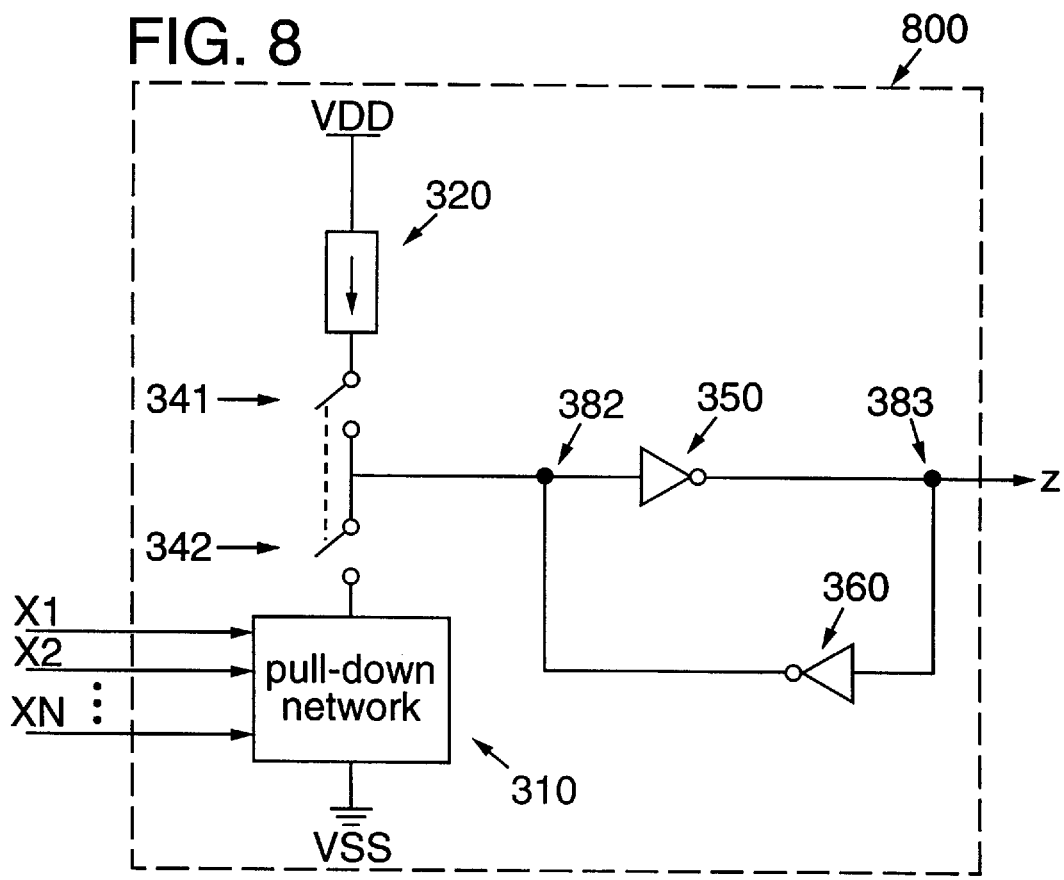

FIG. 8 shows a block diagram of gate/latch 800 in accordance with yet another embodiment of the invention. Gate/latch 800 is identical to gate/latch 300 of FIG. 3 except that switch 370 is omitted. Inverters 350 and 360 still implement a latching function, but inverter 360 sinks some of the current from current source 320 which may slow the rate of change in the voltage at node 382.

FIG. 9 shows a gate/latch 900 in accordance with another embodiment of the invention. Gate/latch 900 contains many of the same elements as gate/latch 400 of FIG. 4, and the above description of those elements also applies to gate/latch 900. Gate/latch 900 differs from gate/latch 400 in that a tri-state buffer 970 replaces and implements the functions of switch 370 and inverter 360 of gate/latch 400. Tri-state buffer 970 contains p-channel transistors 961 and 971 connected in series between supply voltage VDD and node 382 and n-channel transistors 972 and 962 connected in series between node 382 and reference voltage VSS. P-channel transistor 971 and n-channel transistor 972 enable and disable tri-state buffer 970, and p-channel transistor 461 and n-channel transistor 462 have gates coupled together to form an inverting pair. In flow-through mode, signals E and $\overline{E}$ close transistors 441 and 442 and disable tri-state buffer 970 so that pull-down network 310 and transistor 441 control voltage on node 382. In latched mode, signals E and $\overline{E}$ open transistors 441 and 442 and enable tri-state buffer 970 so that tri-state buffer 970 inverts the output signal from inverter 350.

Although the invention has been described with reference to particular embodiments, the description is only an example of the invention's applications and should not be taken as a limitation. In particular, even though much of preceding discussion was aimed at using pull-down networks to implement a logic function, alternative embodiments of this invention include implementing the logic function with a pull-up network or a combination of pull-down and pull-up networks. Various other adaptations and combinations of features of the embodiments disclosed are within the scope of the invention as defined by the following claims.

I claim:

1. A circuit comprising:
    a latch;
    a logic gate having an output terminal coupled to an input terminal of the latch, wherein when input signals to the logic gate are selected constant voltages, the logic gate dissipates power while power through the logic gate is enabled;
    a first switching circuit coupled to disable power through the logic gate when the latch operates in a latched mode and enable power through the logic gate when the latch operates in a flow-through mode; and
    a second switching circuit coupled between the logic gate and the input terminal of the latch, wherein the second switching circuit connects the logic gate to the latch when the latch operates in the flow-through mode and disconnects the logic gate from the latch when the latch operates in the latched mode.

2. The circuit of claim 1, wherein:
    the first switching circuit comprises a first transistor coupled between the input terminal of the latch and a source of a first voltage, wherein the first transistor is closed when the latch operates in the flow-through mode and open when the latch operates in the latched mode; and
    the logic gate comprises a network of transistors coupled between the input terminal of the latch and a source of a second voltage.

3. The circuit of claim 2, wherein the first voltage is a supply voltage for the circuit and the second voltage is a ground voltage for the circuit.

4. The circuit of claim 2, wherein the input signals are applied to gates of transistors in the network, and the network conducts when a Boolean operation on states of the input signals has a first result and the network does not conduct when the Boolean operation on the states of the input signals has a second result that differs from the first result.

5. The circuit of claim 4, wherein the second switching circuit comprises a second transistor coupled between the network and the input terminal of the latch, wherein the second transistor is closed when the latch operates in the flow-through mode and open when the latch operates in the latched mode.

6. The circuit of claim 2, wherein:

the latch comprises a first inverting circuit and a second inverting circuit;

the input terminal of the latch is coupled to an input terminal of the first inverting circuit;

an output terminal of the first inverting circuit is coupled to an input terminal of the second inverting circuit; and the switching circuit further comprises means for applying an output voltage from the second inverting circuit to the input terminal of the first inverting circuit when operating the latch in latched mode.

7. The circuit of claim 6, wherein the first inverting circuit is an inverter.

8. The circuit of claim 7, wherein the second inverting circuit is an inverter.

9. The circuit of claim 6, wherein the second inverting circuit is tri-state buffer.

10. The circuit of claim 1, wherein:

the first and second switching circuits are connected in series between a source of a first voltage and a first node;

the latch is connected to a second node that is between the first and second switching circuits; and the logic gate comprises a network of transistors coupled between the first node and a source of a second voltage.

11. The circuit of claim 1, wherein:

the first and second switching circuits are connected in series between a source of a first voltage and the input terminal of the latch;

the logic gate comprises a network of transistors coupled between a second node and a source of a second voltage, the second node being between the first switching circuit and the second switching circuit.

12. The circuit of claim 1, wherein the logic gate performs a logical AND operation on a first input signal and a second input signal to the logic gate.

* * * * *